(12) United States Patent
Van Der Voort et al.

(10) Patent No.: US 12,242,206 B2
(45) Date of Patent: Mar. 4, 2025

(54) METHOD FOR PREPARING A SUBSTRATE AND LITHOGRAPHIC APPARATUS

(71) Applicant: ASML NETHERLANDS B.V., Veldhoven (NL)

(72) Inventors: Dennis Dominic Van Der Voort, Veldhoven (NL); Nicolaas Ten Kate, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 120 days.

(21) Appl. No.: 17/911,498

(22) PCT Filed: Mar. 3, 2021

(86) PCT No.: PCT/EP2021/055361
§ 371 (c)(1),
(2) Date: Sep. 14, 2022

(87) PCT Pub. No.: WO2021/197747
PCT Pub. Date: Oct. 7, 2021

(65) Prior Publication Data
US 2023/0095108 A1    Mar. 30, 2023

(30) Foreign Application Priority Data
Mar. 31, 2020    (EP) .................................... 20167081

(51) Int. Cl.
*G03F 7/00* (2006.01)
(52) U.S. Cl.
CPC ............................. *G03F 7/70875* (2013.01)

(58) Field of Classification Search
CPC ................ G03F 7/70875; G03F 7/707; G03F 7/70783; G03F 7/70341
See application file for complete search history.

(56) References Cited

U.S. PATENT DOCUMENTS

| | | | |
|---|---|---|---|
| 4,503,335 A | 3/1985 | Takahashi | |
| 9,829,804 B1 * | 11/2017 | Scheffers | G03F 7/70875 |
| 10,416,574 B2 * | 9/2019 | Koevoets | G03F 7/70258 |
| 10,747,127 B2 * | 8/2020 | Van Der Meulen | G03F 7/70783 |
| 11,500,298 B2 * | 11/2022 | Monkman | G03F 7/707 |

(Continued)

FOREIGN PATENT DOCUMENTS

JP    2010267684    11/2010

OTHER PUBLICATIONS

International Search Report and Written Opinion issued in corresponding PCT Patent Application No. PCT/EP2021/055361, dated Jul. 28, 2021.

*Primary Examiner* — Hung V Nguyen
(74) *Attorney, Agent, or Firm* — Pillsbury Winthrop Shaw Pittman, LLP

(57) ABSTRACT

A method for preparing a substrate for an exposure process of a lithographic manufacturing method, the method including imposing different local temperatures across the substrate so as to induce different thermal expansion across the substrate before the exposure process. This method is for compensating for deformation of the substrate induced when the substrate is positioned on a substrate table of a lithographic apparatus. There is also provided a local temperature applicator to implement this technique and to a lithographic apparatus including such a local temperature applicator.

20 Claims, 7 Drawing Sheets

(56) References Cited

U.S. PATENT DOCUMENTS

| | | | |
|---|---|---|---|
| 11,693,326 B1* | 7/2023 | Pan | G03F 7/70891 |
| | | | 355/30 |
| 11,822,256 B2* | 11/2023 | Chang | G03F 7/70741 |
| 2004/0207824 A1 | 10/2004 | Lof et al. | |
| 2010/0045949 A1 | 2/2010 | Nakano et al. | |
| 2012/0307216 A1 | 12/2012 | Laurent et al. | |

* cited by examiner

METHOD FOR PREPARING A SUBSTRATE AND LITHOGRAPHIC APPARATUS

CROSS-REFERENCE TO RELATED APPLICATIONS

This application is the U.S. national phase entry of PCT Patent Application No. PCT/EP2021/055361, which was filed on Mar. 3, 2021, which claims priority of European Patent Application No. 20167081.7 which was filed on 31 Mar. 2020, and which is incorporated herein in its entirety by reference.

FIELD

The present invention relates to a lithographic apparatus and a method for preparing a substrate.

BACKGROUND

A lithographic apparatus is a machine that applies a desired pattern onto a substrate, usually onto a target portion of the substrate. A lithographic apparatus can be used, for example, in the manufacture of integrated circuits (ICs).

The substrate is positioned on a substrate table for the desired pattern to be applied to the substrate. The substrate can deform when it is positioned on the substrate table.

It is desirable to compensate for deformation of the substrate induced when the substrate is positioned on the substrate table.

SUMMARY

According to an aspect of the invention, there is provided a method for preparing a substrate for an exposure process of a lithographic manufacturing method, the method comprising: imposing different local temperatures across the substrate so as to induce different thermal expansion across the substrate before the exposure process.

According to an aspect of the invention, there is provided a lithographic apparatus configured to expose a substrate to patterned radiation, the lithographic apparatus comprising: a local temperature applicator configured to impose different local temperatures across the substrate so as to induce different thermal expansion across the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
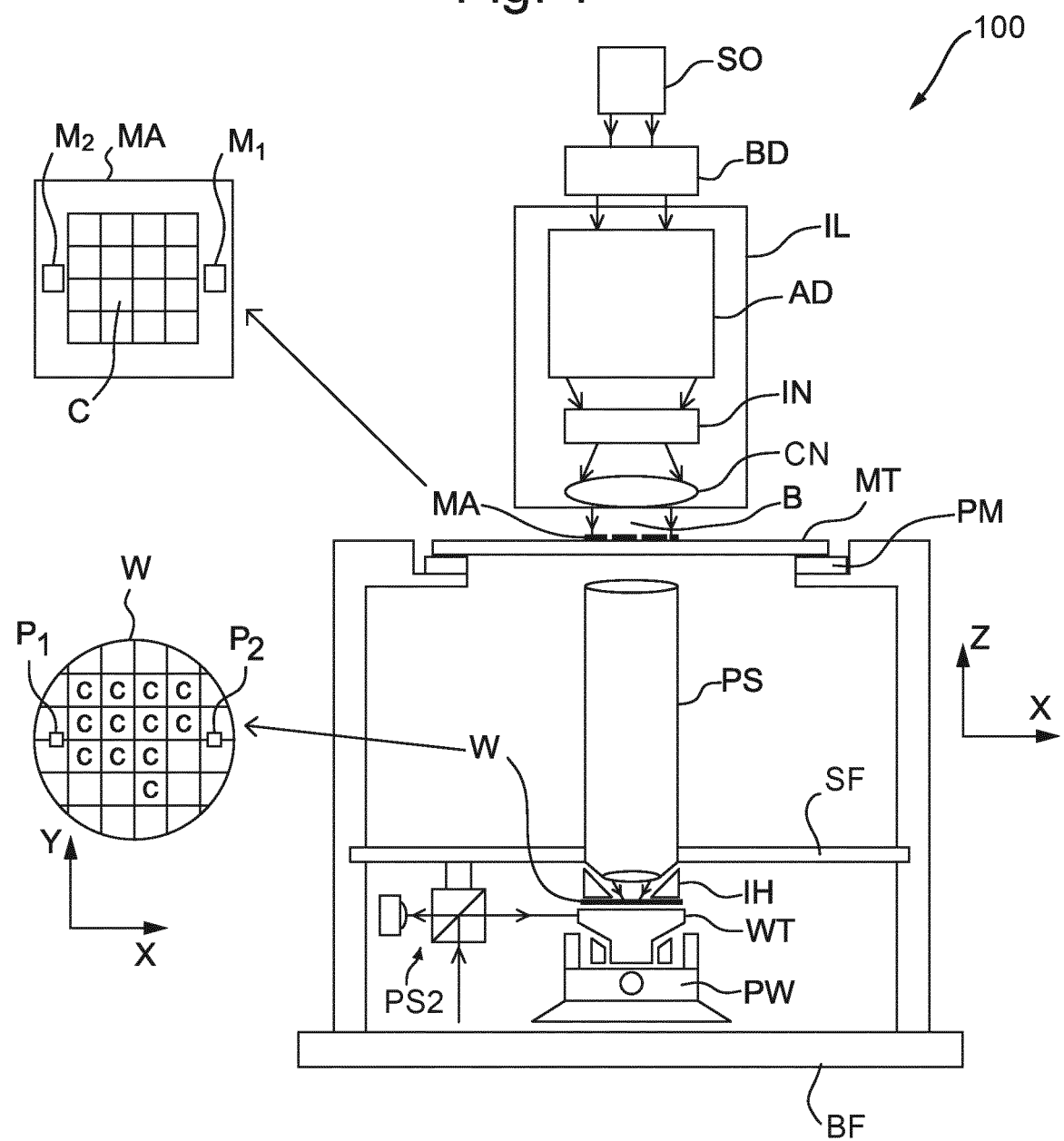
FIG. 1 depicts a lithographic apparatus according to an embodiment of the invention.

FIG. 1 schematically depicts a lithographic apparatus 100 according to an embodiment of the invention. The lithographic apparatus 100 includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device MA in accordance with certain parameters. The lithographic apparatus 100 also includes a substrate table (e.g. a wafer table) WT constructed to hold a substrate (e.g. a resist coated wafer) W and connected to a second positioning device PW configured to accurately position the substrate W in accordance with certain parameters. The lithographic apparatus 100 further includes a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The mask support structure MT supports, i.e. bears the weight of, the patterning device MA. The mask support structure MT holds the patterning device MA in a manner that depends on the orientation of the patterning device MA, the design of the lithographic apparatus 100, and other conditions, such as for example whether or not the patterning device MA is held in a vacuum environment. The mask support structure MT can use mechanical, vacuum, electrostatic or other clamping techniques to hold the patterning device. The mask support structure MT may be a frame or a table, for example, which may be fixed or movable as required. The mask support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart the radiation beam B with a pattern in its cross-section so as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Assist features may be placed on the patterning device MA to enable isolated and/or semi-isolated design features to be patterned as though they were more dense than they actually are. Generally, the pattern imparted to the radiation beam B will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system PS, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The illumination system IL may include an adjuster AD configured to adjust the angular intensity distribution of the radiation beam B. Generally, at least the outer and/or inner radial extent (commonly referred to as σ-outer and σ-inner, respectively) of the intensity distribution in a pupil plane of the illumination system IL can be adjusted. In addition, the illumination system IL may include various other components, such as an integrator IN and a condenser CN. The illumination system IL may be used to condition the radiation beam B, to have a desired uniformity and intensity distribution in its cross section. The illumination system IL may or may not be considered to form part of the lithographic apparatus 100. For example, the illumination system IL may be an integral part of the lithographic apparatus 100 or may be a separate entity from the lithographic apparatus 100. In the latter case, the lithographic apparatus 100 may be configured to allow the illumination system IL to be mounted thereon. Optionally, the illumination system IL is detachable and may be separately provided (for example, by the lithographic apparatus manufacturer or another supplier).

As here depicted, the lithographic apparatus 100 is of a transmissive type (e.g. employing a transmissive mask). Alternatively, the lithographic apparatus 100 may be of a reflective type (e.g. employing a programmable mirror array of a type as referred to above, or employing a reflective mask).

The lithographic apparatus 100 may be of a type having two (dual stage) or more substrate tables WT (and/or two or more mask support structures MT, e.g. mask tables). In such a "multiple stage" lithographic apparatus 100 the additional substrate tables WT and/or mask support structures MT may be used in parallel, or preparatory steps may be carried out on one or more substrate tables WT and/or mask support structures MT while one or more other substrate tables WT and/or mask support structures MT are being used for exposure.

The patterning device MA is held on the mask support structure MT. The radiation beam B is incident on the patterning device MA. The radiation beam B is patterned by the patterning device MA. After being reflected from the patterning device MA, the radiation beam B passes through the projection system PS. The projection system PS focuses the radiation beam B onto a target portion C of the substrate W. The first positioner PM and a first position sensor (e.g., an interferometric device, linear encoder or capacitive sensor) can be used to accurately position the patterning device MA with respect to the path of the radiation beam B. The first position sensor is not explicitly shown in FIG. 1. With the aid of the second positioner PW and a second position sensor PS2 (e.g., an interferometric device, linear encoder or capacitive sensor), the substrate table WT can be moved accurately, e.g., so as to position different target portions C in the path of the radiation beam B.

In general, movement of the mask support structure MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioner PW. In the case of a stepper (as opposed to a scanner) the mask support structure MT may be connected to a short-stroke actuator only, or may be fixed. The patterning device MA may be aligned using mask alignment marks $M_1$, $M_2$. The substrate W may be aligned using substrate alignment marks $P_1$, $P_2$. Although the substrate alignment marks $P_1$, $P_2$ as illustrated occupy dedicated target portions C, they may be located between target portions C (these are known as scribe-lane alignment marks). Similarly, in situations in which more than one die is provided on the patterning device MA, the mask alignment marks $M_1$, $M_2$ may be located between the dies.

Immersion techniques can be used to increase the numerical aperture NA of the projection system PS. As depicted in FIG. 1, in an embodiment the lithographic apparatus 100 is of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus 100, for example, between the patterning device MA and the projection system PS. The term "immersion" as used herein does not mean that a structure, such as the substrate W, must be submerged in liquid, but rather only means that a liquid is located between the projection system PS and the substrate W during exposure. It is not essential for immersion techniques to be used. In an embodiment the lithographic apparatus 100 is a dry system that does not have immersion liquid in the space between the projection system PS and the substrate W. In an embodiment, EUV radiation is used in the exposure processes on the substrate W. In an embodiment the space between the projection system PS and the substrate W is at vacuum pressure.

Referring to FIG. 1, the illuminator IL receives a radiation beam from a source module SO. The source module SO and the lithographic apparatus 100 may be separate entities, for example when the source module SO is an excimer laser. In such cases, the source module SO is not considered to form part of the lithographic apparatus 100 and radiation is passed from the source module SO to the illumination system IL with the aid of a beam delivery system BD. In an embodiment the beam delivery system BD includes, for example, suitable directing mirrors and/or a beam expander. In other cases the source module SO may be an integral part of the lithographic apparatus 100, for example when the source module SO is a mercury lamp. The source module SO and the illumination system IL, together with the beam delivery system BD if required, may be referred to as a radiation system.

Arrangements for providing liquid between a final element of the projection system PS and the substrate W can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

Figure 2:
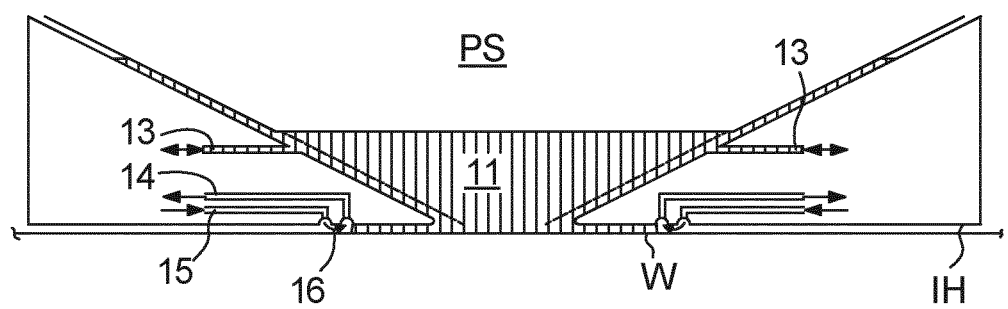
FIG. 2 depicts part of a lithographic apparatus according to an embodiment of the invention.

As depicted in FIG. 1 the liquid supply system is provided with a liquid confinement structure IH which extends along at least a part of a boundary of the space between the final element of the projection system PS and the substrate W, substrate table WT or both. Such an arrangement is illustrated in FIG. 2. The arrangement illustrated in FIG. 2 and described below may be applied to the lithographic apparatus described above and illustrated in FIG. 1.

FIG. 2 schematically depicts a localized liquid supply system or fluid handling system with a liquid confinement structure IH, which extends along at least a part of a boundary of the space 11 between the final element of the projection system PS and the substrate table WT or substrate W. (Please note that reference in the following text to the surface of the substrate W also refers in addition or in the alternative to a surface of the substrate table WT, unless expressly stated otherwise.) In an embodiment, a seal is formed between the liquid confinement structure IH and the surface of the substrate W. The seal may be a contactless seal such as a gas seal 16 (such a system with a gas seal is disclosed in European patent application publication no. EP-A-1,420,298) or a liquid seal.

The liquid confinement structure IH at least partly contains liquid in the space 11 between the final element of the projection system PS and the substrate W. The space 11 is at least partly formed by the liquid confinement structure IH positioned below and surrounding the final element of the projection system PS. Liquid is brought into the space 11 below the projection system PS and within the liquid confinement structure IH by a liquid inlet/outlet 13. The liquid may be removed by a liquid inlet/outlet 13. In an embodiment one of two liquid inlet/outlets 13 supplies the liquid while the other liquid inlet/outlet 13 removes the liquid depending on the scanning direction.

The liquid may be contained in the space 11 by the gas seal 16. During use, the gas seal 16 is formed between the bottom of the liquid confinement structure IH and the surface of the substrate W. The gas in the gas seal 16 is provided under pressure via an inlet 15 to the gap between the liquid confinement structure IH and substrate W. The gas is extracted via an outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure IH and the substrate W contains the liquid in the space 11. Such a system is disclosed in United States patent application publication no. US 2004-0207824, which is hereby incorporated by reference in its entirety. In an embodiment, the liquid confinement structure IH does not have a gas seal.

In a localized area liquid supply system, the substrate W is moved under the projection system PS and the liquid supply system. When an edge of the substrate W is to be imaged, an edge of the substrate W (or other object) will pass under the space 11. When a sensor on the substrate table WT (or on a measurement table) is to be imaged, an edge of the substrate W (or other object) will pass under the space 11. A dummy substrate or so-called closing plate can be positioned under the liquid supply system to enable, for example, substrate swap to take place. When the substrate table WT is to be moved such that a dummy substrate or so-called closing plate can be positioned under the liquid supply system, an edge of the substrate W (or other object) will pass under the space 11. Liquid may leak into the gap between the substrate W and substrate table WT. This liquid may be forced in under hydrostatic or hydrodynamic pressure or the force of a gas knife or other gas flow creating device.

Figure 3:
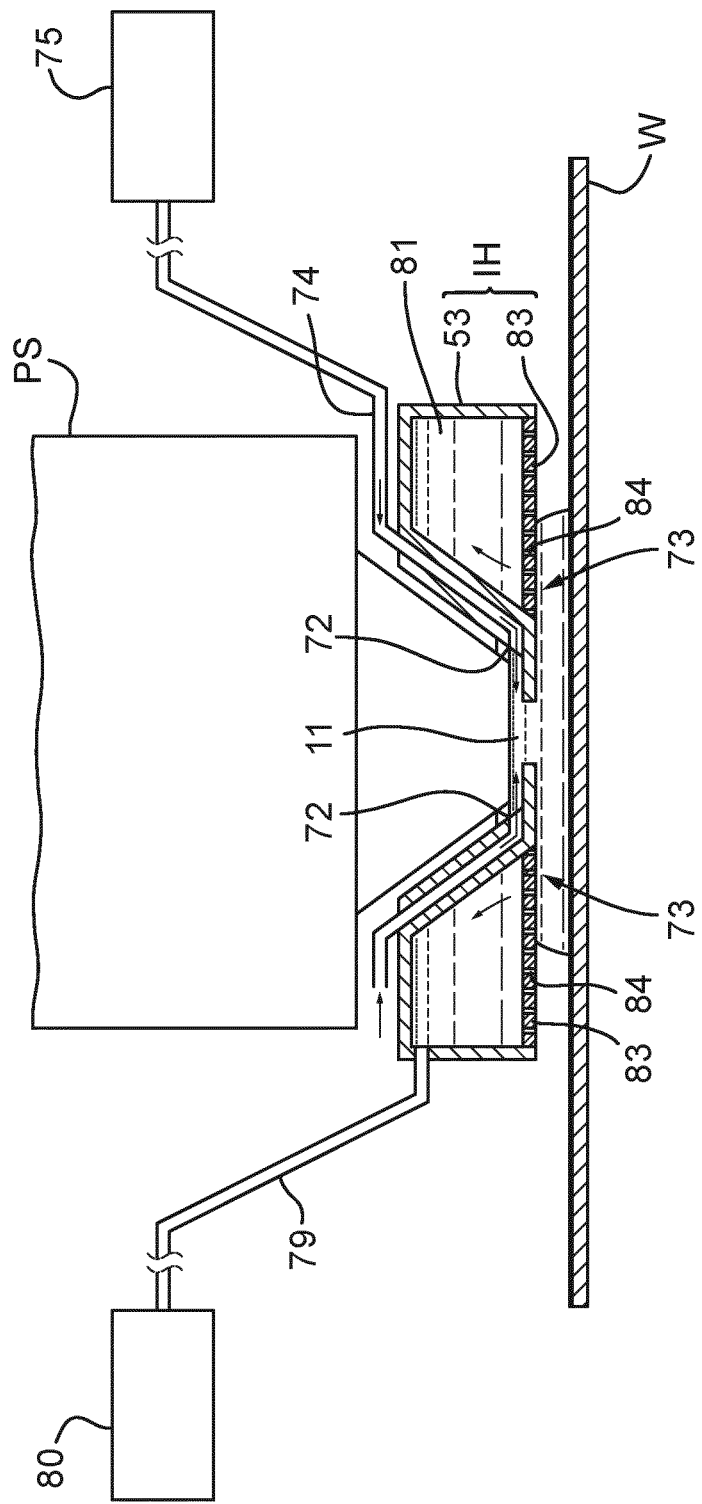
FIG. 3 depicts part of a lithographic apparatus according to an embodiment of the invention.

FIG. 3 is a side cross sectional view that depicts a further liquid supply system or fluid handling system according to an embodiment. The arrangement illustrated in FIG. 3 and described below may be applied to the lithographic apparatus 100 described above and illustrated in FIG. 1. The liquid supply system is provided with a liquid confinement structure IH, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.)

The liquid confinement structure IH at least partly contains liquid in the space 11 between the final element of the projection system PS and the substrate W. The space 11 is at least partly formed by the liquid confinement structure IH positioned below and surrounding the final element of the projection system PS. In an embodiment, the liquid confinement structure IH comprises a main body member 53 and a porous member 83. The porous member 83 is plate shaped and has a plurality of holes (i.e., openings or pores). In an embodiment, the porous member 83 is a mesh plate wherein numerous small holes 84 are formed in a mesh. Such a system is disclosed in United States patent application publication no. US 2010/0045949 A1, which is hereby incorporated by reference in its entirety.

The main body member 53 comprises supply ports 72, which are capable of supplying the liquid to the space 11, and a recovery port 73, which is capable of recovering the liquid from the space 11. The supply ports 72 are connected to a liquid supply apparatus 75 via passageways 74. The liquid supply apparatus 75 is capable of supplying the liquid to the supply ports 72. The liquid that is fed from the liquid supply apparatus 75 is supplied to each of the supply ports 72 through the corresponding passageway 74. The supply ports 72 are disposed in the vicinity of the optical path at prescribed positions of the main body member 53 that face the optical path. The recovery port 73 is capable of recovering the liquid from the space 11. The recovery port 73 is connected to a liquid recovery apparatus 80 via a passageway 79. The liquid recovery apparatus 80 comprises a vacuum system and is capable of recovering the liquid by suctioning it via the recovery port 73. The liquid recovery apparatus 80 recovers the liquid LQ recovered via the recovery port 23 through the passageway 29. The porous member 83 is disposed in the recovery port 73.

In an embodiment, to form the space 11 with the liquid between the projection system PS and the liquid confinement structure IH on one side and the substrate W on the other side, liquid is supplied from the supply ports 72 to the space 11 and the pressure in a recovery chamber 81 in the liquid confinement structure IH is adjusted to a negative pressure so as to recover the liquid via the holes 84 (i.e., the recovery port 73) of the porous member 83. Performing the liquid supply operation using the supply ports 72 and the liquid recovery operation using the porous member 83 forms the space 11 between the projection system PS and the liquid confinement structure IH on one side and the substrate W on the other side.

In use of the lithographic apparatus 100, a substrate W undergoes different lithography steps and process steps. A substrate W may be cleaned, for example by a wet chemical treatment. The substrate W may be heated to a temperature sufficient to drive off any moisture that may be present on the surface of the substrate W. The substrate W may be covered with a layer of resist (e.g. photoresist). The substrate W may be prebaked to drive off excess photoresist solvent. The substrate W is then exposed so that a pattern in the radiation beam B is transferred onto the substrate W. The substrate W may then undergo developing, etching and removal of the resist. These steps may be repeated for a further layer on the substrate W.

As depicted in FIG. 1, in an embodiment the lithographic apparatus 100 comprises a substrate table WT. The substrate table WT is configured to support a substrate W for an exposure process. In an exposure process, the substrate W is exposed to a radiation beam B to form a pattern on the substrate W via a liquid (i.e. immersion liquid).

In an embodiment the lithographic apparatus 100 comprises a store unit. The store unit may be part of a substrate handler that controls movement of the substrate W through the lithographic apparatus 100. When a substrate W is entered into a lithographic apparatus 100, the substrate W is positioned first on the store unit. Subsequently, the substrate W is moved from the store unit, after which the substrate W is positioned on the substrate table WT for an exposure process. For example, in an embodiment the substrate W is moved from the store unit to a temperature stabilization unit. The temperature stabilization unit is configured to impose a uniform temperature on the substrate W, for example to bring the temperature of the substrate W closer to the temperature of the substrate table WT. In an embodiment the substrate W is moved from the temperature stabilization unit to the substrate table WT. Hence, the substrate W is positioned on the store unit before it is moved onto the substrate table WT. In an embodiment the store unit comprises a substrate support configured to support the substrate W.

An embodiment of the invention is a method for preparing a substrate W for an exposure process of a lithographic manufacturing method. During an exposure process, the substrate W is irradiated with a patterned beam of radiation. The exposure process is performed when the substrate W is supported on the substrate table WT. The substrate W is prepared before the substrate W is loaded onto the substrate table WT.

In an embodiment, the method comprises imposing different local temperatures across the substrate W. The different local temperatures induce different thermal expansions across the substrate W before the substrate W is loaded onto the substrate table WT. The deformation of the substrate W can be controlled through thermal expansion (which may include contraction). In an embodiment, the substrate W is stressed through thermal expansion before being loaded onto the substrate table WT. The substrate W is pre-stressed. In order to stress the substrate W, the temperature of the substrate W is controlled. Different regions of the substrate W are heated and/or cooled to reach different temperatures from each other. As a result, different regions of the substrate W undergo different levels of thermal expansion, thereby deforming the substrate W in a controlled manner. The deformations are substantially within the plane of the substrate W.

Figure 4:
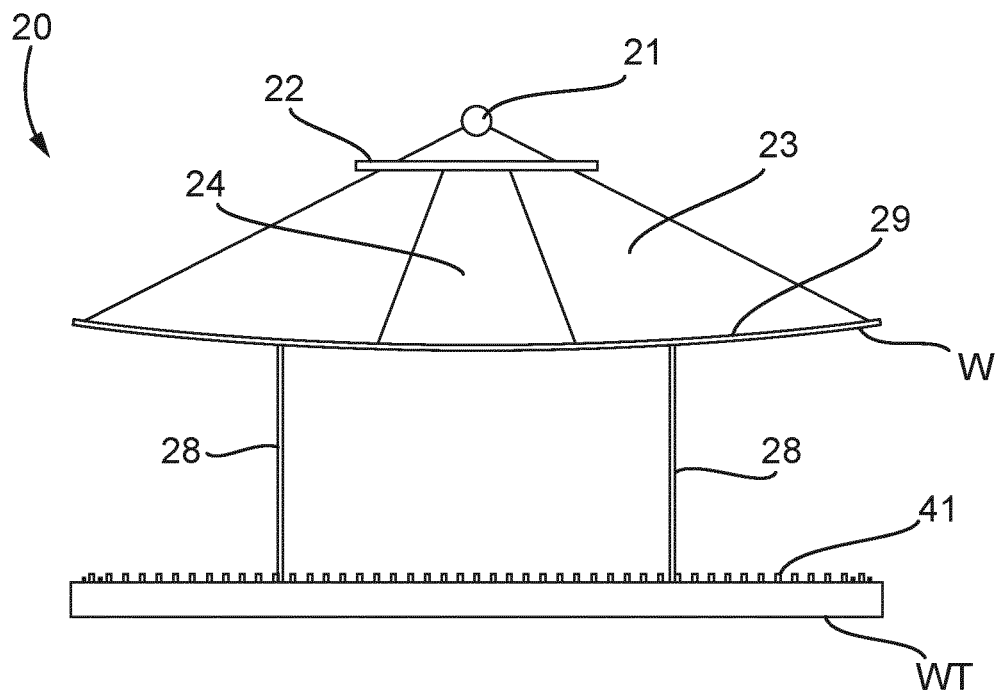
FIG. 4 depicts an applicator for imposing different local temperatures on a substrate by radiation according to an embodiment of the invention.

By pre-stressing the substrate W in a controlled manner, it is possible to preemptively reduce and/or correct for undesirable deformations of the substrate W that can be induced when the substrate W is mounted on the substrate table WT. The inventors have found that clamping the substrate W onto the substrate table WT can induce deformations within the plane of the substrate W. The inventors have found that these undesirable deformations are at least partly the result of tribological interactions at the burls 41 of the substrate table WT. As shown in FIG. 4, in an embodiment the substrate table WT comprises a plurality of burls 41 at its upper surface (i.e. the surface that faces the substrate W). The burls 41 have distal ends in a plane for supporting the substrate W. The distal ends of the burls 41 are configured to support the substrate W in a flat orientation. The burls 41 help to reduce the amount of contact between the substrate W and the substrate table WT. This reduces the possibility of unwanted particles undesirably reducing flatness of the substrate W as a result of being trapped between contacting surfaces of the substrate W and the substrate table WT. The deformation of the substrate W caused by clamping the substrate W onto the substrate table WT can lead to undesirable overlay errors.

The amplitude and position of the undesirable deformations depend on several factors including the shape of the substrate W, the strength of the vacuum or electromagnetic field clamping the substrate W onto the substrate table WT, any coating applied to the substrate W or the substrate table WT, the sequence used for loading the substrate W onto the substrate table WT and the condition of the burls 41 of the substrate table WT (the condition can vary over time). It is possible to measure the undesirable deformations resulting from interactions at the burls 41. The results of the measurements can be used to determine the different local temperatures to be imposed on different regions of the substrate W (for future substrates). In an embodiment the free form shape of each substrate W is measured and used as an input to the different local temperature to be imposed.

In an embodiment, the different local temperatures are imposed on one of the two main surfaces of the substrate W. The two main surfaces of the substrate W are the upper surface that receives the patterned radiation during the exposure process, and the lower surface which faces the substrate table WT. When a local temperature is imposed on one of the two main surfaces, it rapidly affects the temperature on the other main surface and through the depth of the substrate W. Typically, it may take less than about 10 ms for heat changes at one of the two main surfaces to conduct to the other main surface through the thickness of the substrate W. In contrast, it takes much longer for the heat (i.e. local temperature differences) to conduct horizontally across the substrate W. This is because the substrate W is much wider than it is deep.

In an embodiment, the substrate W has a thickness of at least 0.5 mm. In an embodiment the substrate W has a thickness of at most 1 mm. In an embodiment, the substrate W has a thickness of about 0.8 mm. In an embodiment the substrate W has a diameter or at least 100 mm, and optionally at least 200 mm. In an embodiment the substrate W has a diameter of at most 1000 mm, and optionally at most 500 mm. In an embodiment, the substrate W has a diameter of 300 mm. In an embodiment the substrate W is made of silicon. In an embodiment the substrate W has a thermal diffusivity of about 70-80 $mm^2s^{-1}$.

In an embodiment, the time between the substrate W first making contact with the substrate table WT and the substrate W being clamped on the substrate table WT is of the order of about 100 ms. The conduction of heat (and hence reduction of local temperature differences) in the horizontal direction across the substrate W typically takes longer than 100 ms (the actual amount depending on the resolution with which the different local temperatures are imposed). It is possible for the substrate W to be clamped onto the substrate table WT with the different local temperatures still imposed for different areas of the substrate W.

In an embodiment, the substrate table WT has a different temperature from the substrate W. In general, the substrate table WT has a much greater mass than the substrate W. When the substrate W is loaded onto the substrate table WT, heat is transferred between the substrate W and the substrate table WT. The heat transfer between the substrate table WT and the substrate W may take of the order of about 5 to 10 seconds. This is much longer than the amount of time required to load the substrate W onto the substrate table WT. As a result, the deformations induced in the substrate W during the loading procedure are fixed before the thermal conduction between the substrate W and the substrate table WT has occurred. This means that when the substrate W would otherwise expand or contract on the substrate table WT due to heat transfer with the substrate table WT, the friction and clamping force to the substrate table WT keep the substrate W in place. This makes it possible to preemptively reduce and/or correct for the undesirable deformations in the substrate W that are induced by clamping the substrate W onto the substrate table WT.

After the substrate W has been clamped onto the substrate table WT it is largely no longer possible to alter the deformations of the substrate W. This is because of the strength of the force clamping the substrate W onto the substrate table WT. By imposing the different local temperatures across the substrate W during preparation of the substrate W, it is possible to compensate for the mechanical deformations caused by clamping the substrate W onto the substrate table WT. After the substrate W has been clamped onto the substrate table WT, heat is transferred between the substrate W and the substrate table WT such that the temperature of the substrate W changes. However, the temperature change of the substrate W does not significantly affect the local deformations of the substrate W.

In an embodiment the method for preparing the substrate W comprises uniformly heating or cooling the substrate W, and subsequently locally heating or cooling the substrate W so as to impose the different local temperatures. In an embodiment the lithographic apparatus 100 comprises a temperature stabilization unit. In an embodiment, the temperature stabilization unit uses a gas bearing to uniformly bring the temperature of the substrate W to a value closer to the temperature of the substrate table WT.

In an embodiment, the method for preparing the substrate W comprises uniformly cooling the substrate W and locally heating the cooled substrate W so as to impose the different local temperatures. It is quicker to impose different local temperatures by heating different regions of the substrate W by different amounts compared to cooling different regions of the substrate W by different amounts. By locally heating the substrate W, the different local temperatures can be imposed more quickly. This helps to reduce the time for the different local temperatures to diffuse before the substrate W is clamped onto the substrate table WT. However, in an alternative embodiment the different local temperatures are imposed by cooling the substrate W by different amounts.

The way that the different local temperatures are imposed on the substrate W is not particularly limited. Any form of heat transfer can be used to impose the different local temperatures. A plurality of different methods of heat transfer may be used in combination to impose the different local temperatures.

In an embodiment the lithographic apparatus 100 comprises a local temperature applicator 20. The local temperature applicator 20 is configured to impose the different local temperatures across the substrate W so as to induce varying thermal expansion across the substrate W. As shown in FIG. 4, in an embodiment the different local temperatures are at least partially applied by a radiation source 21. In an embodiment the applicator 20 comprises a radiation source 21. The radiation source 21 is configured to selectively apply different doses of radiation to respective regions of the substrate W so as to at least partially impose the different local temperatures. In an embodiment the radiation source 21 comprises a heat lamp. The radiation source 21 can quickly change the temperature of the substrate W.

As shown in FIG. 4, in an embodiment the applicator 20 comprises a mask 22. In an embodiment the mask 22 is adjustable. The mask 22 is configured to control which regions of the substrate W are irradiated by the radiation source 21. For example, as shown in FIG. 4, the mask 22 may be controlled to block out the radiation from reaching a central part of the substrate W. FIG. 4 shows a shadow 24 over the central region of the substrate W. Meanwhile, outer regions of the substrate W are irradiated by the radiation 23 from the radiation source 21. By adjusting the mask 22, the regions of the substrate W reached by the radiation 23 of the radiation source 21 can be controlled. As shown in FIG. 4, in an embodiment, the different local temperatures are applied to the upper surface 29 of the substrate W. The heat transfers quickly through the thickness of the substrate W. In an embodiment the different local temperatures remain different from each other when the substrate W is initially clamped onto the substrate table WT.

In an embodiment the radiation source 21 comprises a laser. In an embodiment, the radiation source 21 is configured to scan over the substrate W so as to apply the different local temperatures (i.e. the temperature profile). In an embodiment, the dose of radiation is varied across the substrate W by controlling the intensity and/or duration of exposure by the radiation 23. The method of controlled irradiation is not particularly limited. The wavelength of radiation 23 used is not particularly limited. In an embodiment the radiation 23 used to heat the substrate has a longer wavelength than the radiation used to expose the photoresist on the substrate W during an exposure process. In an embodiment the radiation 23 used to heat the substrate W has a wavelength in the range of from about 700 nm to about 800 nm. A wavelength in the range of from about 700 nm to about 800 nm would be particularly suitable for heating the substrate W considering material absorption and resist insensitivity. It is desirable for the radiation 23 used for heating the substrate W to apply the local temperatures to not interact with photoresist on the substrate W.

As shown in FIG. 4, in an embodiment the method comprises supporting the substrate W on a plurality of pins 28. The pins 28 extend through the substrate table WT used for the exposure process. In an embodiment, at least three pins 28 are used for supporting the substrate W in a controlled manner above the substrate table WT. The pins 28 extend through respective holes in the substrate table WT. In an embodiment, the method comprises controlling the height of the substrate W supported by the pins 28 relative to the substrate table WT so as to mount the substrate W onto the substrate table WT. The movement of the pins 28 is controlled so as to lower the substrate W onto the substrate table WT. The pins 28 are lowered through the holes in the substrate table WT.

In an embodiment, the different local temperatures are at least partially imposed while the height of the substrate W relative to the substrate table WT changes. The different local temperatures may be imposed while the substrate W is being lowered onto the substrate table WT. This helps to reduce the amount of time during which the different local temperatures can diffuse across the substrate W before the substrate W is clamped onto the substrate table WT. This helps to improve the precision with which the deformations in the substrate W can be corrected and/or compensated for. As will be explained in more detail below, the local temperatures can be applied at different times during the preparation of the substrate W.

Figure 5:
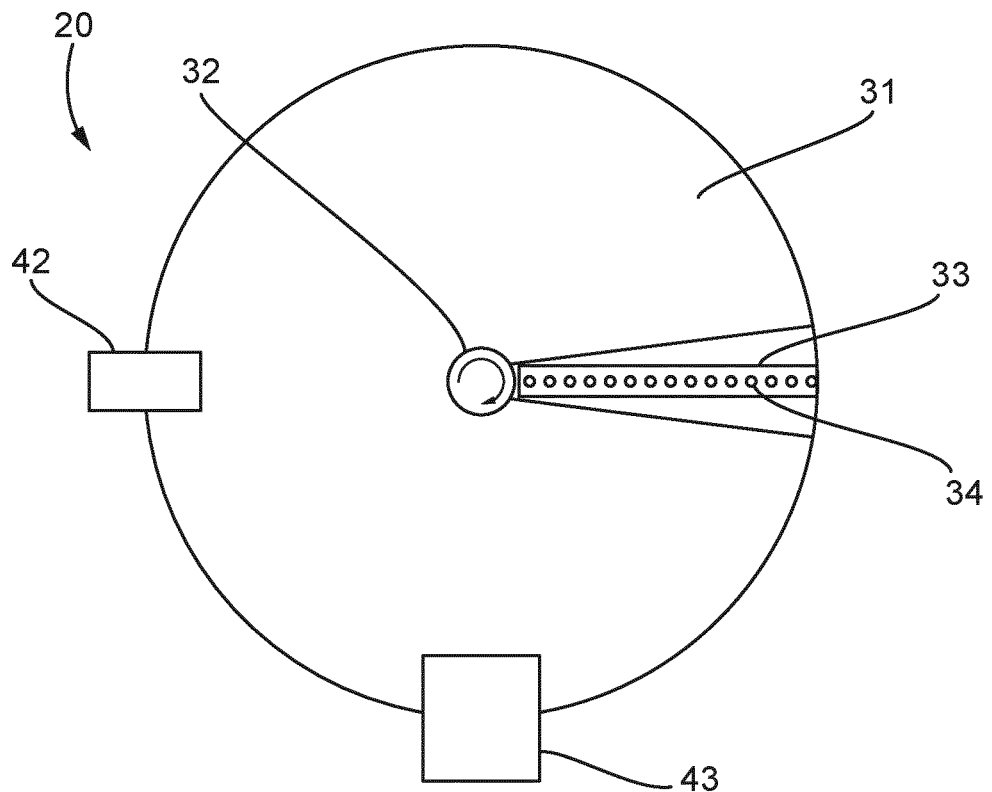
FIG. 5 is a plan view of an applicator for imposing different local temperatures on a substrate by convection according to an embodiment of the invention.

FIG. 5 is a schematic plan view of a local temperature applicator 20 according to an embodiment of the invention. As shown in FIG. 5, in an embodiment the applicator 20 comprises a plurality of nozzles 34. The nozzles 34 are configured to supply fluid toward the substrate W so as to at least partially impose the different local temperatures. As shown in FIG. 5, in an embodiment the different local temperatures are at least partially applied by flowing fluid toward the substrate W.

The applicator 20 shown in FIG. 5 is only one example of how fluid is flowed toward the substrate W so as to at least partially impose the different local temperatures. Alternative implementations are possible. The applicator 20 is configured to control the temperature of the substrate W. As shown in FIG. 5, in an embodiment the applicator 20 comprises an array 33 of nozzles 34. As shown in FIG. 5, in an embodiment the array 33 extends over at least the radius of the substrate W.

The applicator 20 shown in FIG. 5 comprises a rotator 32. The rotator 32 is configured to clamp the center of the substrate W (not shown in FIG. 5).

Figure 6:
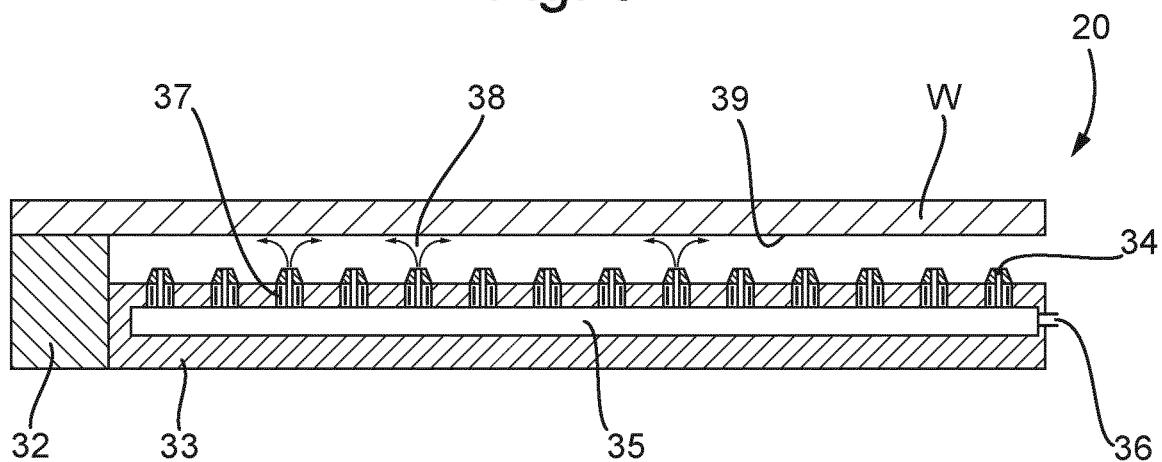
FIG. 6 is a cross-sectional view of part of the applicator shown in FIG. 5 supporting a substrate according to an embodiment of the invention.

FIG. 6 is a schematic cross-sectional view of one half of the substrate W clamped onto the rotator 32 of the applicator 20 shown in FIG. 5. As shown in FIG. 6, in an embodiment the substrate W is positioned over the nozzles 34 when the substrate W is clamped onto the rotator 32. As shown in FIG. 6, in an embodiment the fluid 38 is flowed toward the underside 39 of the substrate W. The temperature differences quickly extend across the thickness of the substrate W.

As indicated in FIG. 5, the applicator 20 is configured to rotate the substrate W about its center above a support 31. The applicator 20 is configured to flow the fluid 30 toward the underside 39 of the substrate W as the substrate W is rotated by the rotator 32. In an embodiment, the applicator 20 is configured such that each nozzle 34 is individually controllable to flow fluid 38 toward the substrate W. In an embodiment, the flow through each nozzle 38 can be individually turned on and turned off. In an embodiment, the flow rate through each nozzle 38 can be individually controlled.

In an embodiment, the temperature of the fluid 38 can be controlled individually for each nozzle 34. As shown in FIG. 6, in an embodiment the applicator 20 comprises heating elements 37 for respective nozzles 34. As shown in FIG. 6, in an embodiment a heating element surrounds at least a part of the nozzle 34 so as to control the temperature of the fluid 38 that flows from the nozzle 34 toward the substrate W. In an embodiment, the fluid is a gas such as air. The fluid 38 that flows toward the underside 39 of the substrate W.

As shown in FIG. 6, in an embodiment the nozzles 34 are connected to a fluid supply port 36. For example, air may be supplied to the nozzles 34 via the fluid supply port 36. As shown in FIG. 6, in an embodiment the applicator 20 comprises a common chamber 35 in fluid communication with the fluid supply port 36. The common chamber 35 is in fluid communication with the nozzles 34. Fluid is supplied through the fluid supply port 36 to the common chamber 35 and out through the nozzles 34 to the underside 39 of the substrate W. In an embodiment, each nozzle 34 is configured to supply the same temperature of fluid 38 to an annular region of the substrate W.

The different regions with the different local temperatures may be divided in accordance with their radius. The regions may be annular shaped. In an alternative embodiment, the regions may correspond to arcs and not complete annuluses. The temperature of the fluid 38 flowed toward the substrate W may be varied as the substrate W is rotated. This allows different temperatures of fluid and thus different local temperatures to be imposed for different arcs of the same annulus.

As shown in FIG. 6, in an embodiment the nozzles are spaced in the radial direction. This makes it easy to create radial temperature profiles of choice. In an embodiment, the nozzles 34 are pulsed to create local variations in substrate temperature. As mentioned above, in an embodiment the temperature of the fluid 38 is varied, for example by using the heating elements 37. However, it is not essential to be able to control the temperature of the fluid 38. In an alternative embodiment, the pulse duration of each nozzle 34 is controlled so as to cool or heat the substrate W to a specific temperature.

In an embodiment, the nozzles 34 are initially used to apply a change to the average temperature of the substrate W. Subsequently, the nozzles 34 may be used to impose the different local temperatures. For example, a change to the average temperature may be applied so as to reduce the difference between the mean temperature of the substrate W and the temperature of the substrate table WT. The different local temperatures can then be imposed. In an embodiment, the change to the average temperature is applied such that the mean temperature of the substrate W is different from the temperature of the substrate table WT. In an embodiment, the combination of the change to the average temperature and the different local temperatures imposed are selected such that after the different local temperatures are imposed, the mean temperature of the substrate W is the same as the temperature of the substrate table WT.

In an embodiment a plurality of radiation sources are provided to heat the substrate W while the substrate W is supported on the rotator 32. The radiation sources may be provided in addition to, or instead of the nozzles 34. Hence, the temperatures can be imposed on the substrate W by radiation and/or convection. In an embodiment, the applicator 20 comprises a thermal conditioner configured to thermally condition the rotator 32 so as to impose the different local temperatures on the substrate W. The thermal conditioner can be provided in addition to, or instead of, the radiation sources and/or the nozzles 34. Hence, the temperatures can be imposed on the substrate W by conduction and/or radiation and/or convection.

It is not essential for the change to the average temperature (e.g. a temperature change that is substantially uniform across the substrate W) to be applied before the different local temperatures are applied. In an alternative embodiment, a change to the average temperature is imposed after the different local temperatures are imposed. For example, in an embodiment the substrate W is clamped onto a substrate support where the different local temperatures are imposed. Subsequently, the substrate W undergoes a change to its average temperature (e.g. cooling).

As shown in FIG. 5, in an embodiment the applicator 20 comprises the linear array 33 of nozzles 34 and a rotator 32 above a support 31. The rotator 32 functions as a turntable. The rotator 32 is configured to rotate the substrate W above the linear array 33 such that the different local temperatures are at least partially imposed while the substrate W is rotated.

As shown in FIG. 5, in an embodiment a gas knife module 42 is provided. The gas knife module 42 is configured to supply a curtain of gas toward the substrate W so as to remove moisture from the periphery of the substrate W while the substrate W is rotated.

As shown in FIG. 5, in an embodiment an alignment module 43 is provided. In an embodiment the alignment module 43 is configured to measure and/or control rotational alignment of the substrate W. In an embodiment the alignment module 43 is configured to identify the position of a marker (e.g. a notch) formed at a known position on the substrate W. For example, a notch may be provided at the edge of the substrate W. The alignment module 43 determines the position of the notch such that the rotational alignment of the substrate W can be accurately controlled for when the substrate W is transferred onto the substrate table WT.

In an embodiment, the method of preparing the substrate W comprises rotationally aligning the substrate W so as to control the rotational position of the substrate W for when it is mounted onto the substrate table WT used for the exposure process. As shown in FIG. 5, in an embodiment the different local temperatures are at least partially imposed during the rotational alignment. In an embodiment, the process of imposing the different local temperatures does not lengthen the overall time required for preparing the substrate W.

In an embodiment, vacuum extraction rings are provided around each nozzle 34 so as to reduce mixing of flows from the different nozzles 34.

Figure 7:
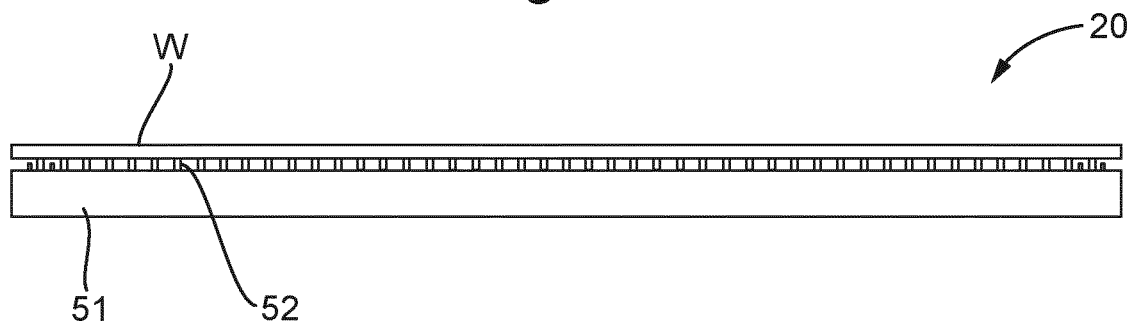
FIG. 7 is a cross-sectional view of an applicator for imposing different local temperatures on a substrate by conduction according to an embodiment of the invention.

FIG. 7 is a schematic cross-sectional view of a local temperature applicator 20 according to an embodiment of the invention. As shown in FIG. 7, in an embodiment the applicator 20 comprises an applicator table 51. The applicator table 51 is configured to support the substrate W. As shown in FIG. 7, in an embodiment the applicator table 51 comprises a plurality of burls 52. The burls 52 have distal ends in a plane for supporting the substrate W.

Figure 8:
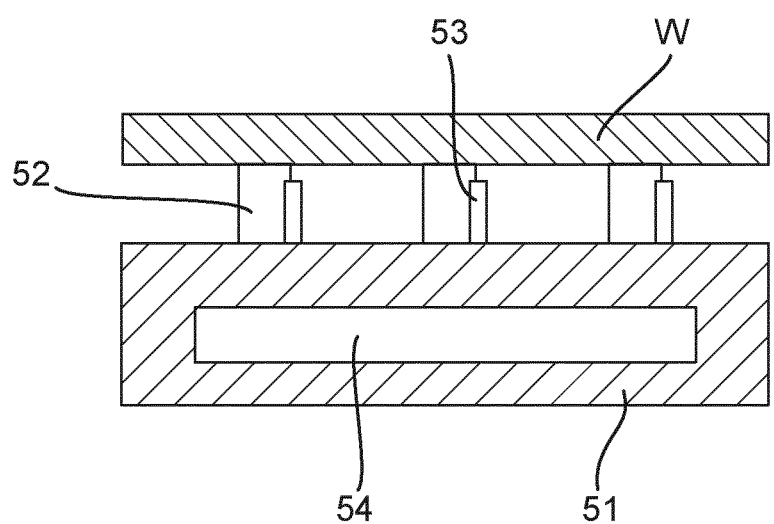
FIG. 8 is a close-up view of part of the applicator shown in FIG. 7.

FIG. 8 is a close-up view of part of the applicator 20 shown in FIG. 7. In particular, FIG. 8 shows a close-up view of three of the burls 52 of the applicator table 51. As shown in FIG. 8, in an embodiment the applicator table 51 comprises a plurality of temperature conditioning elements 53 corresponding to respective regions of the substrate W so as to at least partially impose the different local temperatures. As shown in FIG. 8, in an embodiment the temperature conditioning elements 53 comprise a plurality of heaters at respective burls 52 for locally heating the respective region of the substrate W supported by the burl 52. As shown in FIGS. 7 and 8, in an embodiment the different local temperatures are at least partially applied by conduction from the applicator table 51 supporting the substrate W. As shown in FIG. 8, in an embodiment each temperature conditioning element 53 is attached to a corresponding burl 52. For example, the temperature conditioning element 53 may be a thin film heater.

The number and arrangement of the burls 52 is not particularly limited. In an embodiment, the arrangement of the burls 52 may be substantially the same as the arrangement of the burls 41 of the substrate table WT used for the exposure process. However, this is not necessarily the case. For example, in an embodiment the burls 52 of the applicator table 51 are wider than the burls 41 of the substrate table WT. For example, in an embodiment the burls 52 of the applicator table 51 may have a diameter in the region of about 10 mm. In an embodiment, the burls 52 of the applicator table 51 are laid out in a grid formation (e.g. like a checker board).

As shown in FIG. 8, in an embodiment the applicator table 51 comprises at least one cooling channel 54. The cooling channel 54 is embedded within the applicator table 51. The cooling channel 54 is configured to flow fluid through the applicator table 51 below the substrate W.

In an embodiment, the cooling channel 54 is configured to apply a substantially uniform temperature change to the substrate W. For example, in an embodiment the cooling channel 54 is configured to bring the temperature of the substrate W close to the temperature of the substrate table WT. In an embodiment the applicator 20 is part of the store unit of the lithographic apparatus 100.

In an embodiment the applicator table 51 is configured to rotate the substrate W. In an embodiment, the process of aligning the substrate W may be performed at the same time as the conductive heat transfer using the temperature conditioning elements 53. An embodiment of the invention is expected to reduce and/or compensate for deformations caused by clamping the substrate W without substantially increasing the throughput time.

In an embodiment the applicator table 51 has a much larger mass than that of the substrate W. In an embodiment the temperature conditioning elements 53 are individually controllable so as to apply different local temperatures to different regions of the substrate W. By providing a larger number of temperature conditioning elements 53, the local temperature changes can be applied at a higher resolution (i.e. more granularly). The temperature gradients may be applied through conductive heat transfer at the interface between the burls 52 and the substrate W.

In an embodiment the applicator 20 is configured to impose the different local temperatures such that the temperature of the substrate W varies by at least 1 mK, optionally at least 2 mK, optionally at least 5 mK, optionally at least 10 mK, optionally at least 20 mK and optionally at least 50 mK across the substrate W. The local temperature differences are greater than any minor temperature differences that may occur accidentally when trying to impose a uniform temperature across the substrate W.

The way that the substrate W is divided up into different regions with different local temperatures is not particularly limited. As mentioned above, in an embodiment the different regions are annular shaped (with the central region being circular). In an alternative embodiment, the regions are laid out checker board style. In a further alternative embodiment, the regions correspond to arcs of annuluses.

The resolution with which the different local temperatures are applied is not particularly limited. The higher the resolution, the more precisely the deformation of the substrate W can be compensated and/or corrected for. A lower resolution of temperature differences is less subject to conduction of heat across the substrate W between the time when the different local temperatures are imposed and the time when the substrate W is clamped onto the substrate table WT.

In an embodiment, the applicator 20 is configured to impose the different local temperatures for respective regions of the substrate W having an area of at most 10000 mm$^2$. In an embodiment, the regions of the substrate W corresponding to the local temperatures have an area of at most 5000 mm², optionally at most 2000 mm², optionally at most 1000 mm², optionally at most 500 mm², optionally at most 200 mm², optionally at most 100 mm², optionally at most 50 mm², optionally at most 20 mm², optionally at most 10 mm², optionally at most 5 mm², optionally at most 2 mm² and optionally at most 1 mm².

In an embodiment, different local temperatures are imposed at most 10 s before the substrate W is mounted onto the substrate table WT used for the exposure process. In an embodiment, the different local temperatures are applied at most 5 s, optionally at most 2 s, optionally at most 1 second, optionally at most 500 ms, optionally at most 200 ms, optionally at most 100 ms and optionally at most 50 ms before the substrate W is mounted onto the substrate table WT.

As an example, a central circular part of the substrate W may have one local temperature imposed on it. Three outer annular regions corresponding to different radial positions may have three further different temperatures applied to respective annuluses. Hence, there may be four different regions in total. The number of regions corresponding to different temperatures is not particularly limited.

Figure 9:
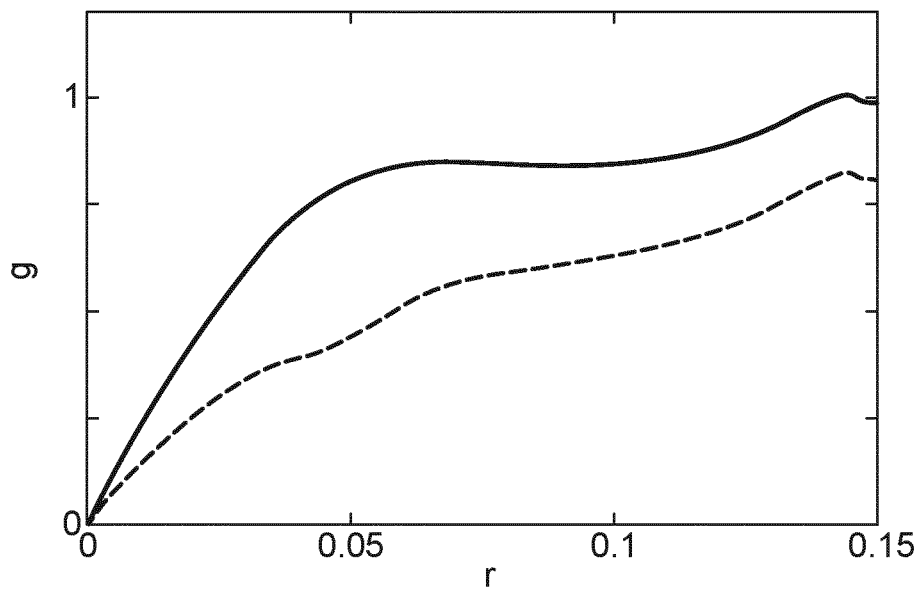
FIG. 9 is a graph showing the relationship between radial position and deformation of a substrate.

FIG. 9 is a graph showing the relationship between radial position of a region on a substrate W and in-plane deformation of the substrate W. As shown in FIG. 9, the horizontal deformation is different for different radial positions on the substrate W. In FIG. 9 the X axis shows the radial position r from the center of the substrate W in meters. The substrate W has a maximum radial position of 0.15 m because the diameter of the substrate W is 300 mm. In FIG. 9, the Y axis shows the cumulative deformation profile g. In FIG. 9, the upper graph line is a comparative example in which no local temperatures are applied to the substrate W before it is clamped onto the substrate table WT. The lower graph line shows an example according to the invention in which different local temperatures are applied across the substrate W. In particular, in the example shown in FIG. 9, the central region of the substrate W (with a radius of 0-40 mm) has a small temperature offset compared to the outer region of the substrate W. Only two different regions with respective local temperatures were provided. As shown in FIG. 9, by applying different local temperatures to different regions of the substrate W, the deformation g when the substrate W was clamped onto the substrate table WT was reduced. As shown in FIG. 9, by applying different local temperatures to different regions of the substrate W, the deformation g when the substrate W was clamped onto the substrate table WT was linearized.

The deformation g can be corrected for and/or compensated for more precisely by providing a larger number of regions and differently controlled local temperatures.

Figure 10:
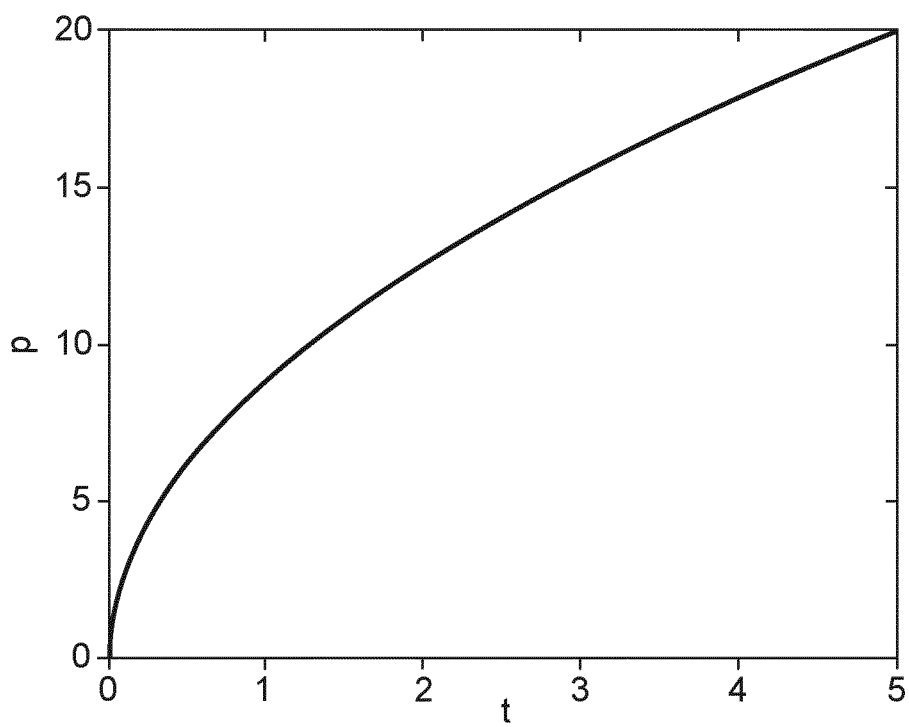
FIG. 10 is a graph showing the relationship between time and diffusion of temperature differences across a substrate.

FIG. 10 is a graph showing the relationship between time t and the distance of heat conduction p across the substrate W. As shown in FIG. 10, heat gradually conducts further across the substrate W as time t increases. After a time of about 5 s, the heat may be expected to have conducted about 20 mm across the substrate W. In FIG. 10, the X axis shows time t in units of seconds. The Y axis shows the diffusion length (Gaussian pulse width) p in units of millimeters. By imposing the local temperatures on the substrate W a shorter time before the substrate W is clamped onto the substrate table WT, a higher resolution of different local temperatures can be applied without the different local temperatures being counteracted by conduction before clamping.

When a substrate W is clamped onto the substrate table WT it is possible for the substrate W to suffer from warpage. The substrate W can undesirably have reduced flatness. According to the invention, by applying temperature variations on specific radii it is possible to correct for local deformations caused by the warpage.

In an embodiment, a device is manufactured by a device manufacturing method comprising using the lithographic apparatus 100 as described above. The lithographic apparatus 100 transfers a pattern from the patterning device MA to the substrate W. In an embodiment, the device manufacturing method comprises the method of preparing the substrate W as described above.

Embodiments are provided according to the following clauses:

1. A substrate conditioning device for lithographic apparatus configured to expose a substrate to patterned radiation, the lithographic apparatus comprising:
   a local temperature applicator configured to impose different local temperatures across the substrate so as to induce different thermal expansion across the substrate.
2. The substrate conditioning device of clause 1, wherein the applicator comprises a radiation source configured to selectively apply different doses of radiation to respective regions of the substrate so as to at least partially impose the different local temperatures.
3. The substrate conditioning device of clause 1 or 2, wherein the applicator comprises a plurality of nozzles configured to supply fluid toward the substrate so as to at least partially impose the different local temperatures.
4. The substrate conditioning device of clause 3, wherein the applicator comprises:
   a linear array of the nozzles; and
   a rotator configured to support and rotate the substrate above the linear array such that the different local temperatures can be at least partially imposed while the substrate is rotated.
5. The substrate conditioning device of any of clauses 1-4, wherein the applicator comprises an applicator table configured to support the substrate, the applicator table comprising a plurality of temperature conditioning elements corresponding to respective regions of the substrate so as to at least partially impose the different local temperatures, and/or wherein the applicator is configured to impose the different local temperatures such that a temperature of the substrate varies by at least 1 mK across the substrate, and/or wherein the applicator is configured to impose the different local temperatures for respective regions of the substrate having an area of at most 10000 mm².
6. The substrate conditioning device of clause 5, wherein the applicator table comprises a plurality of burls having distal ends in a plane for supporting the substrate, wherein the temperature conditioning elements comprise a plurality of heaters at respective burls for locally heating the respective region of the substrate supported by the burl.
7. A local temperature applicator for a lithographic apparatus,
   wherein the local temperature applicator configured to impose different local temperatures across a substrate so as to induce different thermal expansion across the substrate,
   wherein the local temperature applicator comprises:
   a radiation source configured to selectively apply different doses of radiation to respective regions of the substrate so as to at least partially impose the different local temperatures; and an adjustable mask configured to control which region(s) of the substrate have the radiation applied,
wherein the local temperature applicator is arranged such that it can be positioned in the lithographic apparatus above pins that can lower the substrate onto a substrate table.

8. A local temperature applicator for a lithographic apparatus,
wherein the local temperature applicator configured to impose different local temperatures across a substrate so as to induce different thermal expansion across the substrate,
wherein the local temperature applicator comprises:
a linear array of nozzles that extends parallel to at least a radius of the substrate and is configured to supply fluid toward the substrate so as to at least partially impose the different local temperatures; and
a rotator configured to support and rotate the substrate relative to the linear array such that the different local temperatures can be at least partially imposed while the substrate is rotated.

9. A local temperature applicator for a lithographic apparatus,
wherein the local temperature applicator configured to impose different local temperatures across a substrate so as to induce different thermal expansion across the substrate,
wherein the local temperature applicator comprises:
an applicator table configured to support the substrate, the applicator table comprising:
a plurality of burls having distal ends in a plane for supporting the substrate; and
a plurality of temperature conditioning elements corresponding to respective regions of the substrate so as to at least partially impose the different local temperatures,
wherein the temperature conditioning elements comprise a plurality of heaters at respective burls for locally heating the respective region of the substrate supported by the burl.

10. A method for preparing a substrate for an exposure process of a lithographic manufacturing method, the method comprising:
imposing different local temperatures across the substrate so as to induce different thermal expansion across the substrate before the exposure process.

11. The method of clause 10, comprising:
uniformly cooling the substrate; and
locally heating the cooled substrate so as to impose the different local temperatures.

12. The method of clause 10 or 11, wherein the different local temperatures are at least partially applied by a radiation source, and/or wherein the different local temperatures are at least partially applied by flowing fluid toward the substrate, and/or wherein the different local temperatures are at least partially applied by conduction from an applicator table supporting the substrate.

13. The method of any of clauses 10-12, comprising:
supporting the substrate on a plurality of pins that extend through a substrate table used for the exposure process; and
controlling height of the substrate supported by the pins relative to the substrate table so as to mount the substrate onto the substrate table,
wherein the different local temperatures are at least partially imposed while the height of the substrate relative to the substrate table changes.

14. The method of any of clauses 10-13, comprising rotationally aligning the substrate so as to control the rotational position of the substrate for when it is mounted onto a substrate table used for the exposure process, wherein the different local temperatures are at least partially imposed during the rotational alignment.

15. The method of any of clauses 10-14, wherein the different local temperatures are at least partially imposed when the substrate is supported on a substrate table used for the exposure process, and/or wherein the different local temperatures are applied such that a temperature of the substrate varies by at least 1 mK across the substrate, and/or wherein the different local temperatures are imposed for respective regions of the substrate having an area of at most 10000 mm$^2$, and/or wherein the different local temperatures are imposed at most 10 s before the substrate is mounted onto a substrate table used for the exposure process.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A substrate conditioning device for lithographic apparatus configured to expose a substrate to patterned radiation, the substrate conditioning device comprising:
a local temperature applicator configured to impose different local temperatures across the substrate so as to induce different thermal expansion across the substrate, the local temperature applicator arranged to impose the different local temperatures to the substrate prior to when the substrate is clamped to a substrate table of the lithographic apparatus for exposure of the substrate, while clamped on the substrate table, to the patterned radiation.

2. The substrate conditioning device of claim 1, wherein the applicator comprises a radiation source configured to selectively apply different doses of radiation to respective regions of the substrate so as to at least partially impose the different local temperatures.

3. The substrate conditioning device of claim 1, wherein the applicator comprises a plurality of nozzles configured to supply fluid toward the substrate so as to at least partially impose the different local temperatures.

4. The substrate conditioning device of claim 3, wherein the applicator comprises a rotator configured to support and rotate the substrate relative to the array of nozzles such that the different local temperatures can be at least partially imposed while the substrate is rotated.

5. The substrate conditioning device of claim 1, wherein the applicator comprises an applicator table configured to support the substrate, the applicator table comprising a plurality of temperature conditioning elements corresponding to respective regions of the substrate so as to at least partially impose the different local temperatures.

6. The substrate conditioning device of claim 5, wherein the applicator table comprises a plurality of burls having distal ends in a plane for supporting the substrate, wherein the temperature conditioning elements comprise a plurality of heaters at respective burls for locally heating the respective region of the substrate supported by the burl.

7. A method for preparing a substrate for an exposure process of a lithographic manufacturing method, the method comprising:
imposing different local temperatures across the substrate so as to induce different thermal expansion across the substrate before the substrate is clamped to a substrate table for application of the exposure process to the substrate while clamped on the substrate table.

8. The method of claim 7, comprising:
uniformly cooling the substrate; and
locally heating the cooled substrate so as to impose the different local temperatures.

9. The method of claim 7, wherein the different local temperatures are at least partially applied by a radiation source.

10. The method of claim 7, comprising:
supporting the substrate on a plurality of pins that extend through a substrate table used for the exposure process; and
controlling a height of the substrate supported by the pins relative to the substrate table so as to mount the substrate onto the substrate table,
wherein the different local temperatures are at least partially imposed while the height of the substrate relative to the substrate table changes.

11. The method of claim 7, comprising:
rotationally aligning the substrate so as to control a rotational position of the substrate for when it is mounted onto a substrate table used for the exposure process,
wherein the different local temperatures are at least partially imposed during the rotational alignment.

12. The method of claim 7, wherein the different local temperatures are at least partially imposed when the substrate is supported on a substrate table used for the exposure process, and/or wherein the different local temperatures are applied such that a temperature of the substrate varies by at least 1 mK across the substrate, and/or wherein the different local temperatures are imposed for respective regions of the substrate having an area of at most 10000 mm$^2$, and/or wherein the different local temperatures are imposed at most 10 s before the substrate is mounted onto a substrate table used for the exposure process.

13. The method of claim 7, wherein the different local temperatures are at least partially applied by flowing fluid toward the substrate, and/or wherein the different local temperatures are at least partially applied by conduction from an applicator table supporting the substrate.

14. The substrate conditioning device of claim 2, further comprising an adjustable mask configured to control which region of the substrate has the radiation applied.

15. The substrate conditioning device of claim 2, wherein the local temperature applicator is arranged such that it can be positioned in the lithographic apparatus above pins configured to lower the substrate onto a substrate table.

16. The substrate conditioning device of claim 4, wherein the array of nozzles is a linear array of the nozzles.

17. The substrate conditioning device of claim 4, wherein the rotator is configured to support and rotate the substrate above the array of nozzles.

18. A lithographic apparatus comprising:
the substrate conditioning device of claim 1; and
a projection system configured to project patterned radiation onto the substrate.

19. A substrate conditioning device for lithographic apparatus configured to expose a substrate to patterned radiation, the substrate conditioning device comprising:
a local temperature applicator configured to impose different local temperatures across the substrate so as to induce different thermal expansion across the substrate, the local temperature applicator arranged to impose the different local temperatures to the substrate while the substrate is displaced from a surface or protrusions of a substrate table by pins configured to lower the substrate onto the surface or protrusions of the substrate table.

20. The substrate conditioning device of claim 19, wherein the applicator comprises a radiation source configured to selectively apply different doses of radiation to respective regions of the substrate so as to at least partially impose the different local temperatures.

* * * * *